United States Patent [19]
Baker et al.

[11] Patent Number: 4,680,490
[45] Date of Patent: Jul. 14, 1987

[54] MOSFET AC SWITCH

[75] Inventors: Richard H. Baker, Bedford; Edward L. Maddox, Lexington, both of Mass.

[73] Assignee: Gould Inc., Rolling Meadows, Ill.

[21] Appl. No.: 719,110

[22] Filed: Apr. 2, 1985

[51] Int. Cl.[4] ..................... H03K 17/13; H03K 5/153; H03K 17/687
[52] U.S. Cl. .................................... 307/575; 307/584; 307/354; 323/235; 323/319
[58] Field of Search ........ 307/354, 575, 584, 252 UA; 323/235, 319

[56] References Cited

U.S. PATENT DOCUMENTS

| | | | |
|---|---|---|---|
| 3,486,042 | 12/1969 | Watrous | 307/252 UA |
| 3,506,852 | 4/1970 | Hart | 307/354 X |
| 3,881,118 | 4/1975 | Forrest et al. | 323/319 |
| 4,333,048 | 6/1982 | Bishop | 307/252 UA X |
| 4,528,494 | 7/1985 | Bloomer | 323/235 X |
| 4,567,425 | 1/1986 | Bloomer | 323/235 X |

OTHER PUBLICATIONS

Smith, "Zero Crossover Current Sensor"; *IBM-TDB*, vol. 11, No. 5, pp. 501; 10/1968.
Austin, "Zero Voltage Cross-Over Gating Sampler"; RCA Tech. Notes; TN No.: 862.

*Primary Examiner*—Larry N. Anagnos
*Attorney, Agent, or Firm*—John R. Garrett; Edward E. Sachs

[57] ABSTRACT

A solid state relay is responsive to a control signal and is used with an impedance load and a source of alternating electrical power. The solid state relay is used to connect and disconnect the load from the source of alternating electrical power. The solid state relay turns on in response to a control signal and to a substantially zero voltage crossing of the alternating electrical power of the source. The solid state relay turns off in response to the control signal and to a substantially zero current crossing of the alternating electrical power of the source.

12 Claims, 5 Drawing Figures

MOSFET AC SWITCH

BACKGROUND OF THE INVENTION

The present invention relates in general to solid state relays and, in particular, to solid state relays and AC switches using MOSFET devices.

Compared to electromechanical relays, solid state relays have several advantages. These advantages include a longer lifetime, the elimination of contact bounce, and low voltage turn on that reduces both the electromagnetic interference and stress on the attached load. Typical prior art solid state relays utilize triac and SCR components for the switching device. These components when used in a solid state relay have a number of disadvantages. These solid state relays usually are very costly to manufacture, have high leakage current, and are prone to false triggering. Also prior art solid state relays are not readily compatible for use with high impedance logic circuits and CMOS logic.

The present invention overcomes the drawbacks in the prior art solid state relays by the novel use of MOSFET devices.

SUMMARY OF THE INVENTION

The present invention involves a solid state relay responding to a control signal and for use with an impedance load and a source of alternating electrical power. The control signal is used to indicate when the solid state relay is to connect the impedance load to the source. The solid state relay uses two MOSFET devices wired in series in a source to source configuration. The load is connected in series with the MOSFET devices and the total series circuit is connected across the AC source. A portion of the circuitry in the solid state relay operates to turn on the solid state relay in response to the control signal and to a zero voltage crossing of the alternating electrical power of the source. Another portion of the circuitry of the solid state relay provides for turning off the solid state relay responsive to the control signal and to a zero current crossing of the alternating electrical current flowing through the load.

OBJECTS OF THE INVENTION

It is a primary object of the present invention to provide a novel solid state relay especially for low power AC applications. It is another object of the present invention to provide a solid state relay which prevents false triggering and minimizes switch dissipation.

It is yet another object of the present invention to provide a solid state relay which is readily compatible with high impedance logic circuits and CMOS logic.

It is another object of the present invention to provide a solid state relay which turns on only at a zero voltage crossing point of the alternating source voltage.

It is a further object of the present invention to provide a solid state relay which turns off only at a zero current crossing point of the aternating source current.

BRIEF DESCRIPTION OF THE DRAWINGS

The features of the present invention which are believed to be novel are set forth with particularity in the appended claims. The invention together with further objects and advantages may best be understood by reference to the following description taken in conjunction with the accompanying drawings, in the several figures of which like reference numerals identify like elements, and in which:

DESCRIPTION OF PREFERRED EMBODIMENT

Figure 1:
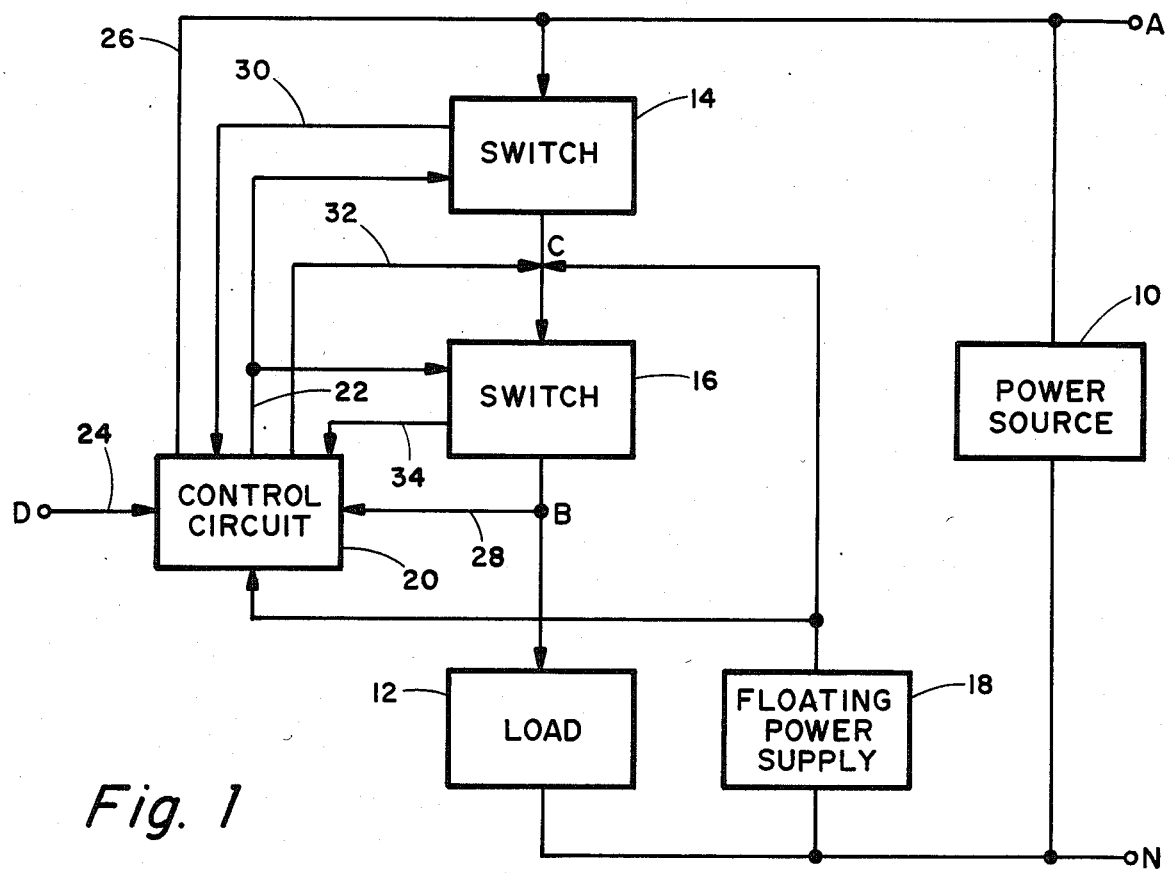
FIG. 1 is a general block diagram of the solid state relay.

The novel solid state relay of the present invention is shown in general block diagram form in FIG. 1. An alternating power source 10 is connected between a hot node A and a neutral node N. An impedance load 12 is connected between node B and node N. A first switch 14 is connected in series with a second switch 16 at common node C and the combination is connected between nodes A and B and in series with the load 12. Thus, when the first and second switches 14 and 16 are closed the load 12 is connected across the alternating power source 10. A floating power supply 18 is referenced to node C and provides a voltage to power the control circuit 20. The control circuit 20 controls the first and second switches 14 and 16 on output line 22. The control circuit 20 receives a control signal on input line 24 from terminal D. This control signal typically may be of the type from CMOS logic circuitry. The control circuit 20 monitors the voltage across switches 14 and 16 through lines 26 and 28 which are connected to nodes A and B respectively. Also the control circuit 20 monitors the current through switch 14 by lines 30 and 32 and monitors the current through switch 16 by lines 34 and 32.

The control means 20 turns on switches 14 and 16 thereby connecting the load to the alternating source 10 in response to the control signal received at terminal D and to a substantially zero voltage crossing of the alternating electrical power of the source 10. The control means 20 turns off switches 14 and 16 in response to the control signal received on terminal D and to a substantially zero current crossing of the alternating electrical power source 10.

Figure 2:
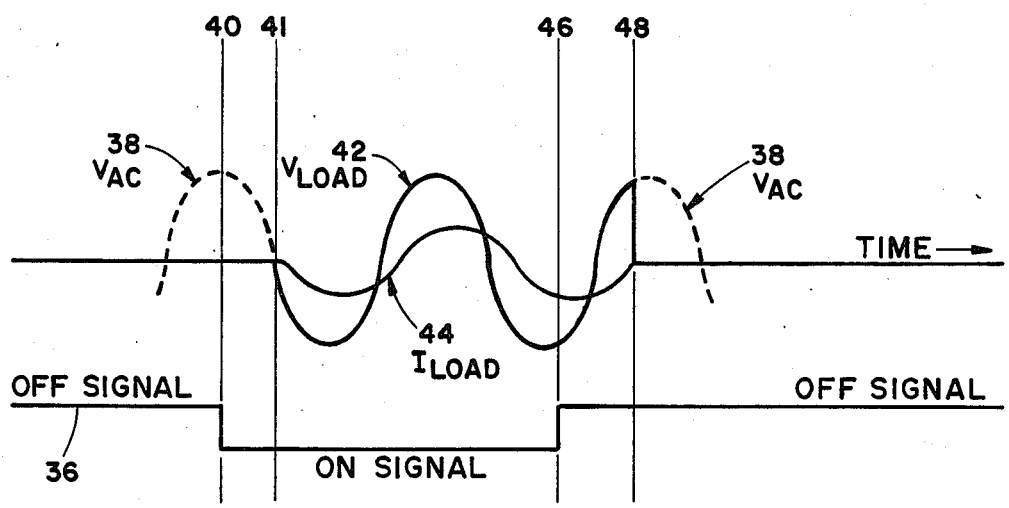
FIG. 2 is a graph comparing the timing of various signals in the solid state relay.

This operation of the circuit is shown diagrammatically in FIG. 2. Data signal 36 may be a typical logic signal operating between two low voltage levels. For one voltage level the signal indicates an off state for the solid state relay and for a second voltage level the signal indicates an on state for the solid state relay. Curve 38 illustrates the varying voltage of the power source 10. At time point 40 the solid state relay receives a data signal 36 indicating that the solid state relay is to turn on. However, the solid state relay does not turn on until time point 41 where the voltage 38 of the power source 10 crosses the zero axis. At time point 41 the solid state relay turns on connecting the load 12 to the source 10. Curves 42 and 44 show the voltage across the load 12 and the current through the load 12, respectively. To illustrate the operation of the present invention the load 12 has been chosen to have a current which is out of phase with the voltage. At time point 46 the data signal 36 instructs the solid state relay to turn off. However, the solid state relay does not turn off until time point 48 when the current through the load 44 crosses the zero point.

Figure 3:
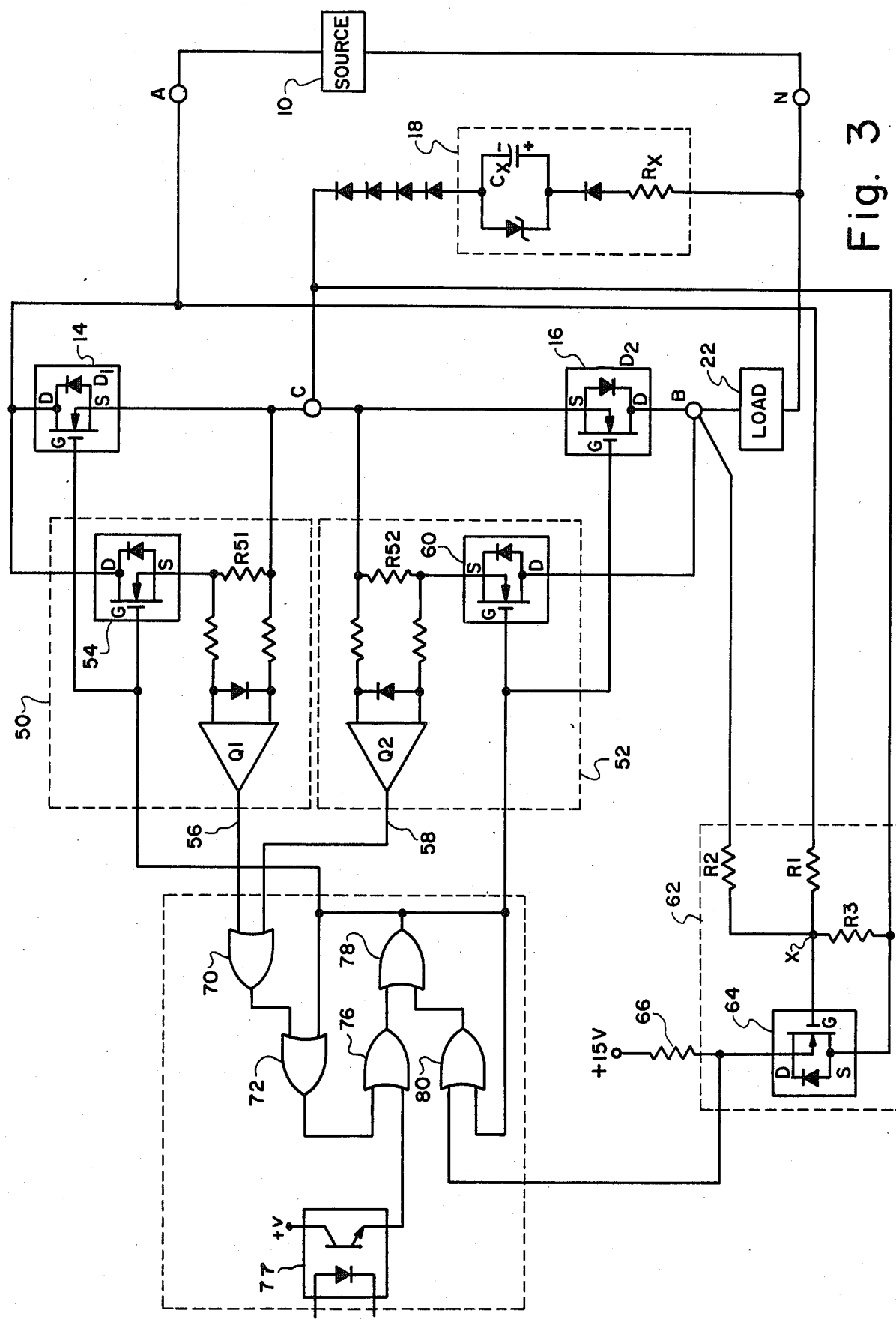
FIG. 3 is a more specific block diagram with circuit elements of the FIG. 1 diagram.

FIG. 3 is a more detailed block diagram of the present invention including circuit elements within each of the blocks. In the preferred embodiment the first switch 14 and the second swtich 16 are field effect transistors (FET) connected in a source to source configuration. The sources of FETs 14 and 16 are connected to node C, the drain of FET 14 is connected to node A and the drain of FET 16 is connected to node B. The gate of FET 14 is connected to the gate of FET 16.

First and second current sensing circuits 50 and 52 are provided. In current sensing circuit 50 FET 54 has its drain connected to the drain of FET 14 and its gate connected to the gate of FET 14. The source of FET 54 is connected to the source of FET 14 through series resistor RS1. When the solid state switch is closed, FET 14 is conducting and the voltage drop across FET 14 is approximately one-half volt for an alternating power source of 110 volts due to the internal resistance of FET 14. Therefore, the voltage drop across RS1 is also approximately one-half volt. Amplifier Q1 measures the voltage across RS1 thereby measuring the current flowing through FET 14. An output signal from amplifier Q1 appears at the output 56 of the current sensing circuit 50 during the positive half cycle of the AC signal from the source 10 when the solid state relay is on. Operation of the second current sensing circuit 52 is similar to the operation described for the first current sensing circuit 50 and the output signal from Q2 which measures the voltage across RS2 and, therefore the current through FET 16, provides an output signal on the output 58 of the second current sensing circuit 52 during the negative half cycle of the AC signal from the source 10. FETs 54 and 60 provide high voltage protection for amplifiers Q1 and Q2.

Voltage sensing circuit 62 is provided and has first and second resistors R1 and R2 connected between node A and node X, and between node B and node X, respectively. The floating power supply 18 provides a reference voltage to node X through R3. Node X is also connected to the gate of FET 64 which has its source connected to the floating power supply 18 and has its drain connected to an output terminal 66.

Logic circuit 68 is provided and in the preferred embodiment has an OR gate 70 which has its inputs connected to terminals 56 and 58 of the first and second current sensing circuits 50 and 52, respectively. The output of the OR gate 70 is connected to one input of an AND gate 72 and the output of AND gate 72 is connected one input of an OR gate 76. The other input of OR gate 76 is connected to an optical isolator 77 which receives the control signal from terminal D. The output of OR gate 76 is connected to one input of AND gate 78. The other input of AND gate 78 is connected to the output of OR gate 80. One input of OR gate 80 is connected to terminal 66 of the voltage sensing circuit 62 for receiving a voltage sensing signal and the other input of OR gate 80 is connected to the output AND gate 78. Similarly, the other input of AND gate 72 is connected to the output of AND gate 78. The output of AND gate 78 is also connected to the gates of FET 54 and 60 and in the first and second current sensing circuits 50 and 52, as well as, to the gates of the first and second FET switches 14 and 16. The overall operation of the circuit will now be described.

When the solid state relay is off, FETs 14, 16, 54 and 60 are all also in the off state. The AC signal from the source 10 across FETs 14 and 16 is blocked because of internal diodes D1 and D2. When the relay is on all four FET devices 14, 16, 54 and 60 are on and FETs 14 and 16 therefore create a short circuit connecting the load 22 to the source 10 across nodes A and N.

The relay turns on only at substantially zero voltage crossing of the source 10 and the relay turns off only at substantially zero current crossings of the source 10. When the relay is in the on satte amplifier Q1 outputs a signal during the positive half cycle of the AC signal of the source 10 and amplifier Q2 outputs a signal during the negative half cycle of the source 10.

Amplifier Q1 turns off only when the voltage drop across RS1 approaches zero, that is when the current flow through FET 14 approaches zero. Similarly, amplifier Q2 turns off only at the same time as amplifier Q1, that is when the voltage across RS2 approaches zero which is when the current through FET 16 approaches zero. FETs 54 and 60 can be turned on only when the output of AND gate 78 is high. When the outputs of amplifiers Q1 and Q2 drop to a low the input to AND gate 72 through OR gate 70 becomes low thereby providing an output from AND gate 72 which is low if the input to OR gate 76 from the optical coupler 77 is low, in addition to the signal from the output from AND gate 72 being low. In this case the output of OR gate 76 will be low. If the input to AND gate 78 is low from OR gate 76 then the output of AND gate 78 will be low, thereby causing FET 54, 60, 14 and 16 to turn off. The input to OR gate 76 from the optical coupler 77 is low only when the data input on terminal D to the control circuit 20 is low, thereby indicating that the relay should turn off.

Figure 4A:
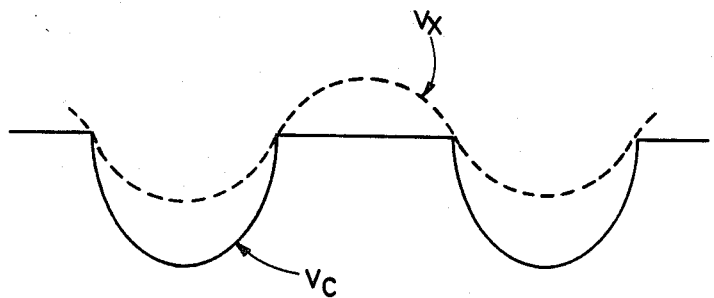
FIGS. 4A and 4B are graphs of signals in the FIG. 3 circuit.
Figure 4B:
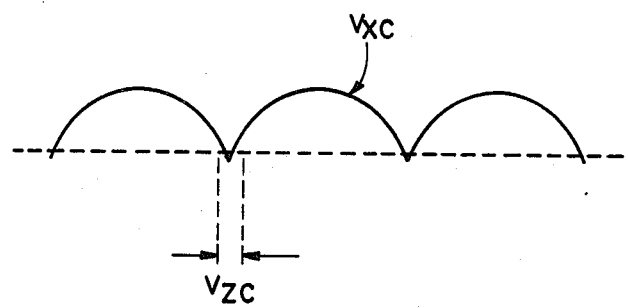

When the relay is off it can be turned on only at the zero voltage crossing. The voltage appearing at node X in the voltage sensing circuit 62 is a full wave rectification of the AC signal from the source 10. This is formed by the voltage divider network R1 and R2 connected across nodes A and B. Thus, the voltage at node X is a sign wave of whose amplitude is about one-fifth the value of the AC signal in phase with the AC signal. The voltage across the gate and source of FET 64 is a whole wave rectified sign wave which is positive going. See FIGS. 4A and 4B. The voltage across the gate and source of FET 64 ($V_{xc}$ in FIG. 4B) is viewed by comparing the voltage at node C to Node X ($v_c$ in FIG. 4A) and the voltage at node X to node N ($v_x$ in FIG. 4A). FET 64 is turned on except for the brief period (in the preferred embodiment approximately 200 microseconds) when the voltage from the gate to source of FET 64 drops to substantially the zero crossing point ($V_{zc}$ in FIG. 4B). At this time the input to OR gate 80 connected to the terminal 66 goes high. At all other times the input to OR gate 80 from terminal 66 remains low. When the relay is initially off the output of AND gate 78 is at a low and therefore the only time that the output of OR gate 80 can go high is when the input to OR gate 80 from FET 64 goes high. This time is when FET 64 turns off at the substantially zero voltage crossing point of the source 10. When FET 64 is turned off one input to AND gate 78 is high. And gate 78 must receive not only the signal from or gate 80 as a high at the zero voltage crossing point but also must receive a signal through OR gate 76 from the optical coupler 77. The signal from the optical coupler 77 is received only when the control signal from terminal D is received indicating for the relay to turn on. When both inputs to AND gate 78 are high the relay turns on. Once the switch is turned on the output of AND gate 78 is coupled back to the inputs of OR gate 80 and AND gate 72 to hold the relay on until the data input on terminal D goes low and the outputs of amplifiers Q1 and Q2 go low at the substantially zero current crossing point.

The invention is not limited to the particular details of the apparatus and method depicted and other modifications and applications are contemplated. Certain other changes may be made in the above described apparatus and method without departing from the true spirit and scope of the invention herein involved. It is intended, therefore, that the subject matter in the above depiction shall be interpreted as illustrative and not in a limiting sense.

What is claimed is:

1. A solid state relay responsive to a control signal and for use with an impedance load and a source of alternating electrical power, said solid state relay comprising:

means for turning on said solid state relay operatively connected to the load and the source and responsive to said control signal having a first predetermined state and to a substantially zero voltage crossing of said alternating electrical power of said source, thereby connecting said load to said source, when said first predetermined state of said control signal and said zero voltage crossing occur at substantially the same point in time, said means for turning on having;

first switch means operatively connected in series with second switch means for connecting and disconnecting the load to the source, said first and second switch means in series with the load, said source operatively connected across said series connection of said first and second switch means and the load;

means for sensing voltage of the source and operatively connected across said first and second switch means and to a common node of said first and second switch means, said voltage sensing means outputting a voltage sensing signal when the source voltage substantially crosses zero;

means for controlling said first and second switch means, said controlling means receiving the control signal and said voltage sensing signal, said controlling means operatively connected to at least said first and second switch means for causing said first and second switch means to turn on or turn off; and wherein said controlling means turns on said first and second switch means when said controlling means receives said voltage sensing signal indicating substantially zero voltage across said first and second switch means and when the control signal indicates turn on, said turning on of said first and second switch means causing the load to be connected to the source;

means for turning off said solid state relay operatively connected to the load and the source and responsive to said control signal having a second predetermined state different from said first predetermined state and to a substantially zero current crossing of said alternating electrical power of said source, thereby disconnecting said load from said source when said second predetermined state of said control signal and said zero current crossing occur at substantially the same point in time.

2. A solid state relay responsive to a control signal and for use with an impedance load and a source of alternating electrical power, said solid state relay comprising:

means for turning on said solid state relay operatively connected to the load and the source and responsive to said control signal having a first predetermined state and to a substantially zero voltage crossing of said alternating electrical power of said source, thereby connecting said load to said source when said first predetermined state of said control signal and said zero voltage crossing occur at substantially the same point in time; and means for turning off said solid state relay operatively connected to the load and the source and responsive to said control signal having a second predetermined state different from said first predetermined state and to a substantially zero current crossing of said alternating electrical power of said source, thereby disconnecting said load from said source when said second predetermined state of said control signal and said zero current crossing occur at substantially the same point in time, said means for turning off having:

first switch means operatively connected in series with second switch means for connecting and disconnecting the load to the souce, said first and second switch means in series with the load, said source operatively connected across said series connection of said first and second switch means and the load;

first means for sensing current through said first switch means and operatively connected to said first switch means, said first current sensing means outputting a first current sensing signal indicative of substantially zero current flow through said first switch means;

second means for sensing current through said second switch means and operatively connected to said second switch means, said second sensing current means outputting a second current sensing signal indicative of substantially zero current flow through said second switch means;

means for controlling said first and second switch means, said controlling means receiving the control signal and said first and second current sensing signals, said controlling means operatively connected to at least said first and second switch means for causing said first and second switch means to turn on or turn off; and wherein said controlling means turns off said first and second switch means when said controlling means receives said first and second current sensing signals indicating substantially zero current flow in said first and second switch means and when the control signal indicates turn off, said turning off of said first and second switch means causing the load to be disconnected from the source.

3. A solid state relay responsive to a control signal and for use with an impedance load and a source of alternating electrical power, said solid state relay comprising:

first switch means operatively connected in series with second switch means for connecting and disconnecting the load to the source, said first and second switch means in series with the load, said source operatively connected across said series connection of said first and second switch means and the load;

first means for sensing current through said first switch means and operatively connected to said first switch means, said first current sensing means outputting a first current sensing signal indicative of substantially zero current flow through said first switch means;

second means for sensing current through said second switch means and operatively connected to said second switch means, said second sensing current means outputting a second current sensing signal indicative of substantially zero current flow through said second switch means;

means for sensing voltage of the source and operatively connected across said first and second switch means and to a common node of said first and second switch means, said voltage sensing means outputting a voltage sensing signal when the source voltage substantially crosses zero;

means for controlling said first and second switch means, said controlling means receiving the control signal, said first and second current sensing signals and said voltage sensing signal, said controlling means operatively connected to at least said first and second switch means for causing said first and second switch means to turn on or turn off; and wherein said controlling means turns off said first and second switch means when said controlling means receives said first and second current sensing signals indicating substantially zero current flow in said first and second switch means and when the control signal indicates turn off at substantially the same point in time when the first and second current sensing signals indicate substantially zero current flow, and wherein said controlling means turns on said first and second switch means when said controlling means receives said voltage sensing signal indicating substantially zero voltage across said first and second switch means and when the control signal indicates turn on at substantially the same point in time when the voltage sensing signal indicates substantially zero voltage, said turning off and on of said first and second switch means causing the load to be disconnected and connected, respectively, to the source.

4. The device described in claim 3 wherein said first and second switch means are first and second field effect transistors connected in a source to source configuration, said first field effect transistor having its drain connected to the hot side of the source and said second field effect transistor having its drain connected to the load, the load connected between said drain of said second field effect transistor and the neutral side of the source.

5. The device described in claim 4 wherein said first and second current sensing means are third and fourth field effect transistors, said third field effect transistor having its drain and gate connected, respectively, to the drain and gate of the first field effect transistor and having its source connected through a first resistance to the source of the first field effect transistor, said fourth field effect transistor having its drain and gate connected, respectively, to the drain and gate of the second field effect transistor and having its source connected through a second resistance to the source of the second field effect transistor.

6. The device described in claim 5 wherein said first and second means for sensing current further comprises first and second differential amplifiers having their inputs connected, respectively, across said first and second resistances, an output of said first differential amplifier being the first current sensing signal and the output of the second differential amplifier being the second current sensing signal.

7. The device described in claim 3 wherein said voltage sensing means comprises a resistive divider network connected across said first and second switch means, a common node of said resistive divider network operatively connected to a common node of said first and second switch means such that said common node of said resistive divider network thereby producing a series of positive sign wave pulses, said common node of said resistive divider network operatively connected to an output device for outputting said voltage sensing signal when the voltage level of said positive sign wave pulses occurs at substantially a zero level.

8. The device described in claim 7 wherein said output device is a field effect transistor having its gate operatively connected to said common node of said resistive divider network and its source operatively connected to the common node of said first and second switch means and its drain having the voltage sensing signal appearing thereon.

9. The device described in claim 3 wherein said controlling means comprises a first OR gate for receiving said first and second current sensing signals on first and second inputs, an output of said first OR gate operatively connected to a first input of a first AND gate, an output of said first AND gate operatively connected to a first input of a second OR gate and a second input of said second OR gate receiving the control signal, an output of said second OR gate operatively connected to a first input of a second AND gate and a second input of said second AND gate operatively connected to an output of a third OR gate, a first input of said third OR gate operatively receiving said voltage sensing signal, and an output of said second AND gate operatively connected to a second input of said first AND gate and a second input of said third OR gate, said output of said second AND gate operatively connected to at least said first and second switch means.

10. The device described in claim 9 wherein said first and second switch means are first and second field effect transistors connected in a source to source configuration, said first field effect transistor having its drain connected to the hot side of the source and said second field effect transistor having its drain connected to the load, the load connected between said drain of said second field effect transistor and the neutral side of the source, and wherein said first and second current sensing means are third and fourth field effect transistors, said third field effect transistor having its drain and gate connected, respectively, to the drain and gate of the first field effect transistor and having its source connected through a first resistance to the source of the first field effect transistor, said fourth field effect transistor having its drain and gate connected, respectively, to the drain and gate of the second field effect transistor and having its source connected through a second resistance to the source of the second field effect transistor, and wherein said output of said second AND gate of said controlling means is operatively connected to the gate of said first, second, third and fourth field effect transistors.

11. The device described in claim 3 wherein said solid state relay further comprises a floating power source means for providing a floating voltage operatively connected to a common node of said first and second switch means and also operatively connected to said voltage sensing means.

12. The device described in claim 11 wherein said floating voltage source means comprises a first resistor operatively connected to the neutral side of the source in series with a first diode in series with a parallel circuit comprising a capacitor and a zener diode which is operatively connected to said common node of said first and second switch means.

* * * * *